US012225801B2

(12) United States Patent
Paik et al.

(10) Patent No.: US 12,225,801 B2
(45) Date of Patent: Feb. 11, 2025

(54) MITIGATING INDUCED EMISSION IN OLED DISPLAY

(71) Applicant: Microsoft Technology Licensing, LLC, Redmond, WA (US)

(72) Inventors: Younghun Paik, Bothell, WA (US); Baek Woon Lee, Bellevue, WA (US); Hyungsoo Kim, Seoul (KR); Ying Zheng, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 413 days.

(21) Appl. No.: 17/657,288

(22) Filed: Mar. 30, 2022

(65) Prior Publication Data

US 2023/0200178 A1 Jun. 22, 2023

Related U.S. Application Data

(60) Provisional application No. 63/265,684, filed on Dec. 17, 2021.

(51) Int. Cl.
*H10K 59/40* (2023.01)
*H10K 59/131* (2023.01)
*H10K 102/10* (2023.01)

(52) U.S. Cl.
CPC .......... *H10K 59/40* (2023.02); *H10K 59/131* (2023.02); *H10K 2102/103* (2023.02)

(58) Field of Classification Search
None
See application file for complete search history.

(56) References Cited

U.S. PATENT DOCUMENTS

| 7,915,723 | B2 | 3/2011 | Sasaki et al. | |
| 9,807,919 | B2 | 10/2017 | Kwong | |
| 9,836,165 | B2 | 12/2017 | Nho et al. | |
| 2016/0329516 | A1 | 11/2016 | Xin et al. | |
| 2018/0033849 | A1* | 2/2018 | Noh | H01L 27/124 |
| 2019/0131551 | A1* | 5/2019 | Xie | H10K 71/00 |
| 2021/0134931 | A1* | 5/2021 | Kim | H10K 59/871 |
| 2021/0202753 | A1* | 7/2021 | Matsueda | H10K 71/00 |

(Continued)

FOREIGN PATENT DOCUMENTS

EP 3331023 A1 6/2018

OTHER PUBLICATIONS

Steudel, et al., "Power saving through state retention in IgZo-TFT AMOLED displays for wearable applications", In Journal of the Society for Information Display, May 4, 2017, 4 Pages.

(Continued)

*Primary Examiner* — Nduka E Ojeh
(74) *Attorney, Agent, or Firm* — Alleman Hall & Tuttle LLP

(57) ABSTRACT

Examples are disclosed that relate to mitigating a piezoelectric response of an organic light emitting diode (OLED) display from static charge. One example provides an electronic device, comprising an organic light emitting diode (OLED) display, the OLED display comprising an organic light emitting layer, a thin film transistor (TFT), a polyimide layer disposed on an opposite side of the TFT as the organic light emitting layer, a buffer layer between the TFT and the polyimide layer, and a conductor positioned to mitigate a piezoelectric response of the polyimide layer to static charge on the OLED display.

16 Claims, 3 Drawing Sheets

(56) References Cited

U.S. PATENT DOCUMENTS

2021/0407343 A1 12/2021 Wu et al.
2022/0208096 A1* 6/2022 Matsueda ............ G09G 3/3275
2022/0310979 A1* 9/2022 Li ........................ H10K 50/868

OTHER PUBLICATIONS

Qi, et al., "Prevention of OLED display damage due to charge accumulation", In Publication of Technical Disclosure Commons, Sep. 18, 2019, pp. 1-4.
Flora, et al., "Flexible Barrier Technology for Enabling Rollable AMOLED Displays and Upscaling Flexible OLED Lighting", In Journal of Symposium Digest of Technical Papers, vol. 44, Issue 1, Jul. 1, 2013, pp. 199-202.
Mativenga, et al., "Fully Transparent and Rollable Electronics", In Journal of ACS Applied Materials & Interfaces, vol. 7, Issue 3, Jan. 14, 2015, pp. 1578-1585.
"International Search Report and Written Opinion Issued in PCT Application No. PCT/US22/043924", Mailed Date: Dec. 19, 2022, 12 Pages.

* cited by examiner

MITIGATING INDUCED EMISSION IN OLED DISPLAY

CROSS REFERENCE TO RELATED APPLICATIONS

This application claims priority to U.S. Provisional Patent Application No. 63/265,684, filed Dec. 17, 2021, the entirety of which is hereby incorporated herein by reference for all purposes.

BACKGROUND

Touch-sensitive displays may be used in many electronic devices, such as smartphones, tablets, and laptops, to display images and receive touch inputs from a user. Touch-sensitive displays may utilize various display technologies, such as a liquid crystal displays (LCD) and organic light-emitting diode (OLED) displays.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to mitigating a piezoelectric response of an organic light emitting diode (OLED) display to static charge on a cover glass of a touch-sensitive display device. One example provides an electronic device comprising an organic light emitting diode (OLED) display. The OLED display comprises an organic light emitting layer, a thin film transistor (TFT), a polyimide layer disposed on an opposite side of the TFT as the organic light emitting layer, a buffer layer between the TFT and the polyimide layer, and a conductor positioned to mitigate a piezoelectric response of the polyimide layer to static charge electronic device.

DETAILED DESCRIPTION

In touch-sensitive display devices that utilize OLED displays, charge buildup on a cover glass layer of a touch display module (a structure comprising a touch sensor and an OLED display) of the device may result in a low intensity emission from the OLED display, which can cause visible artifacts. One possible cause of the emission is static charge buildup on a cover glass layer of the device. Such static charge buildup may induce a piezoelectric charge displacement in a polyimide layer of the touch display module, which in turn can affect the electric field within thin film transistors (TFTs), allowing some current to flow through the TFTs and thus through the corresponding OLED pixels. Such charge accumulation may result from the device manufacturing process, assembly processes, and/or during use (e.g. from a device being carried in a pocket and/or during touch swiping actions by a user).

As one potential solution, the cover glass layer of the touch display module may be connected to system ground, such as via an anti-static coating on an edge of the cover glass, to discharge the charge accumulation on the cover glass. However, such a system ground path may cause radiofrequency interference that can affect antenna performance.

Accordingly, examples are disclosed that relate to OLED display structures configured to avoid such unwanted emission from an OLED display panel arising from static charge, while also avoiding radiofrequency interference issues. Briefly, the disclosed examples include conductive structures that ground or shield the polyimide layer in a touch display module to avoid a piezoelectric conformational change in the polyimide arising from the static charge, thereby helping to avoid low intensity emissions. The disclosed examples further may avoid noticeable radiofrequency interference.

Figure 1:
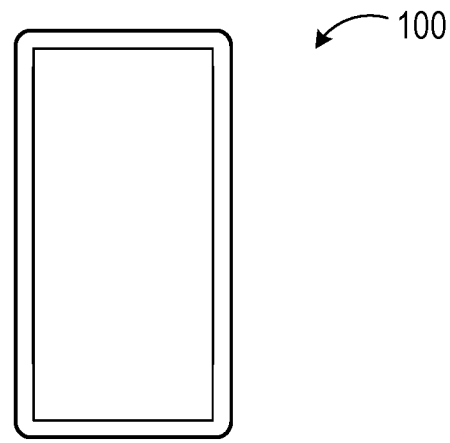
FIG. 1 shows an example mobile device that may utilize a touch-sensitive display.

FIG. 1 shows an example mobile device 100 in the form of a smart phone that may utilize a touch display module comprising an OLED display. In other examples, any other suitable display device may utilize a touch display module according to the disclosed examples, including smartphones, tablets, laptops, computer monitors, television screens, and game consoles, as examples.

Figure 2:
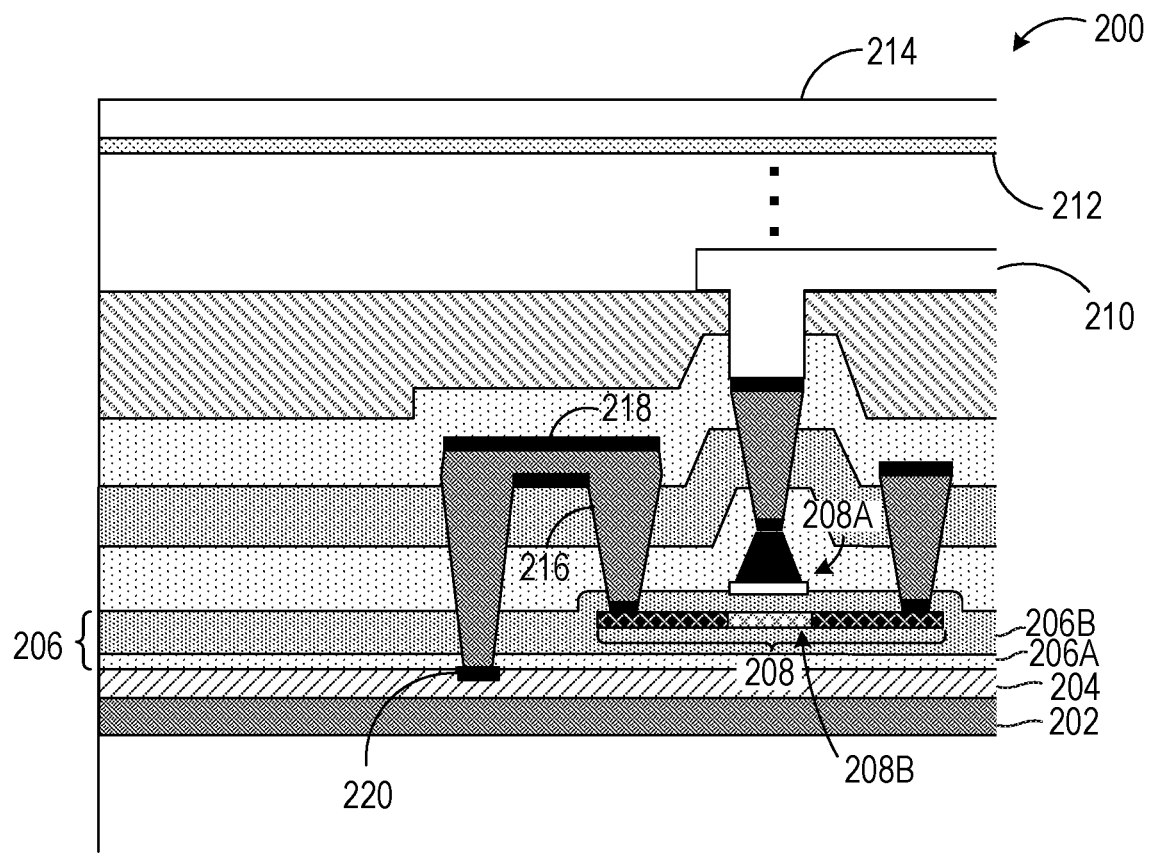
FIG. 2 shows a schematic sectional view of an example OLED display comprising a polyimide layer coupled to a display ground via a TFT ground connection.

FIG. 2 shows an example cross sectional schematic of a portion of an OLED touch display module 200 having a polyimide layer coupled to OLED display ground via a conductor. OLED touch display module 200 is an example of a touch display module that can be used in device 100. OLED touch display module 200 includes a substrate layer 202 (e.g. a glass substrate), a polyimide layer 204, a buffer layer 206 comprising a silicon nitride layer 206A and a silicon oxide layer 206B, a TFT array including TFT 208, a conductor 210 connected to a gate electrode 208A of TFT 208, and an organic light emitting layer 212. A vertical ellipsis indicates that one or more layers may be located between organic light emitting layer 212 and the other layers shown in FIG. 2. A touch sensor including a cover glass layer and electrode/dielectric layers is shown by a single layer 214 disposed over the organic light emitting layer 212.

The TFT array may include TFTs (e.g. TFT 208) for controlling each color sub-pixel (e.g. red, green or blue) of an array of display pixels. Conductors (shown in grey) conduct current for the gate electrode 208A, and also conduct current to and from channel 208B of TFT 208 (e.g. to/from a source and a drain of the TFT). An example conductor is shown as TFT ground connection 216. The light gray appearance of TFT ground connection 216 represents aluminum in this example, and darker gray regions (e.g. conductor 218) represent titanium. Other layers not numbered in FIG. 2 include insulating layers in which the TFT structures and various conductors are contained. In other examples, any other suitable materials than the examples given above may be used for the various layers shown in FIG. 2. Further, in some examples, such as in flexible OLED devices, a glass substrate may be omitted.

As mentioned above, static charge on a cover glass of touch sensor 214 may induce a piezoelectric charge displacement in polyimide layer 204, which may impact the electric field within the channel(s) of one or more TFTs in touch display module 200. This may result in low-level OLED emissions that appear as dim light of one or more colors (e.g. blue) in various regions of the OLED display. Thus, touch display module 200 includes a connection 220 that connects polyimide layer 204 to TFT ground connection 218, thereby connecting polyimide layer 204 to the touch display module ground. The connection of polyimide layer 204 to touch display module ground may help to avoid or attenuate a piezoelectric charge displacement in polyimide layer 204 in response to static charge on the cover glass of touch sensor 214, compared to the use of an ungrounded polyimide layer. This may help to reduce or avoid any unwanted low intensity emission from the OLED emitters.

Connecting polyimide layer 204 to touch display module ground via connection 220 to TFT ground connection 218 may offer various advantages over other methods. For example, connection 220 may be formed using processes already in place on a display module fabrication line. However, connection 220 may utilize different lithographic patterning than examples in which polyimide layer 204 is connected to ground in other manners, and thus may involve the preparation of different lithographic masks and potentially additional deposition/patterning/etching steps.

Figure 3:
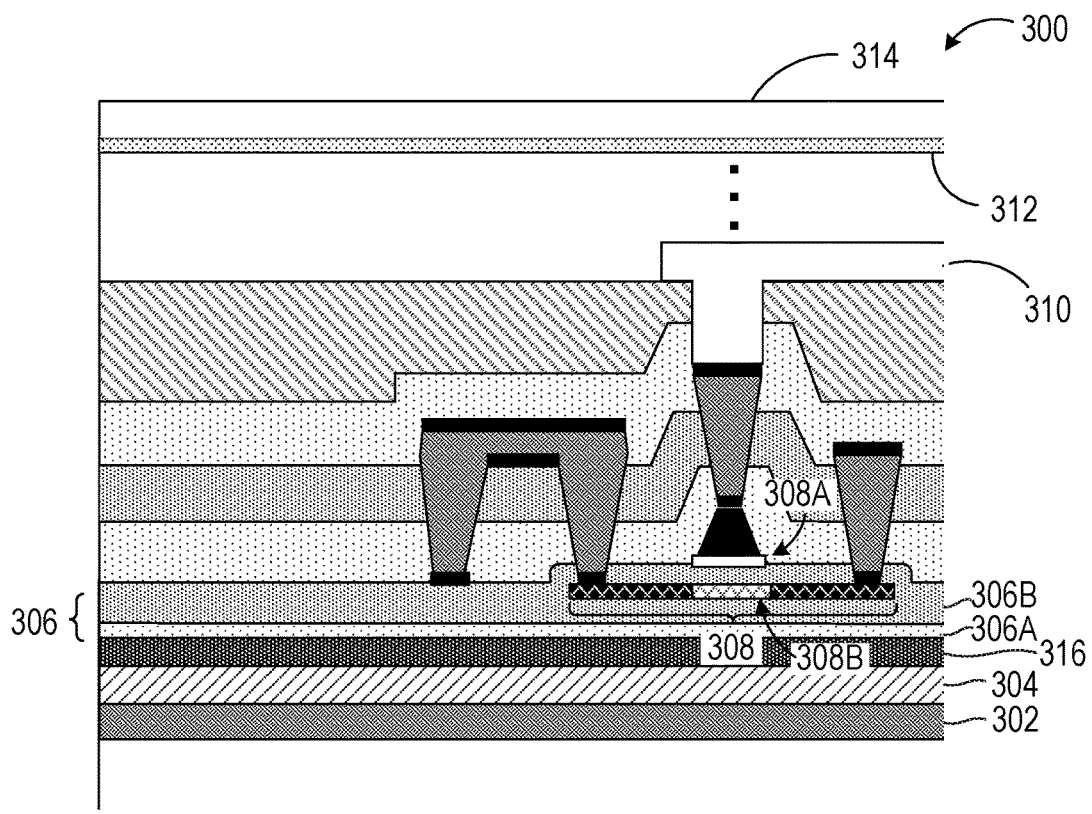
FIG. 3 shows a schematic sectional view of an example OLED display comprising a conductive layer formed on a polyimide layer.

FIG. 3 shows a sectional schematic view of a portion of another example OLED touch display module 300. Touch display module 300 is another example of a touch display module that can be used in device 100. Similar to FIG. 2, OLED touch display module 300 includes a substrate layer 302, a polyimide layer 304, a buffer layer 306 comprising a silicon nitride layer 306A and a silicon oxide layer 306B, a TFT array comprising TFT 308 (which includes a gate electrode 308A and a channel 308B, among other structures), a conductor 310 connected to the gate electrode 308A, an organic light emitting layer 312, and touch sensor 314 including a cover glass layer and electrode/dielectric layers. A vertical ellipsis again is used to indicate that one or more layers may be located between organic light emitting layer 312 and the other layers shown in FIG. 3. Other layers not numbered in FIG. 3 include insulating layers in which the TFT structures and various conductors are contained.

Touch display module 300 further includes a conductive layer 316 disposed on the polyimide layer 304, between the polyimide layer 304 and the buffer layer 306. Conductive layer 316 is connected to ground of the touch display module 300. As opposed to touch display module 200, touch display module 300 may be fabricated without any changes to the various patterning and masking steps used to form a touch display module without conductive layer 316. Conductive layer 316 may be formed using any suitable process. Examples include sputtering, ion beam deposition, evaporation, and chemical vapor deposition. Likewise, conductive layer 316 may be formed from any suitable material or materials. Examples include molybdenum, and possibly other refractory metals, to accommodate possible subsequent high-temperature.

Figure 4:
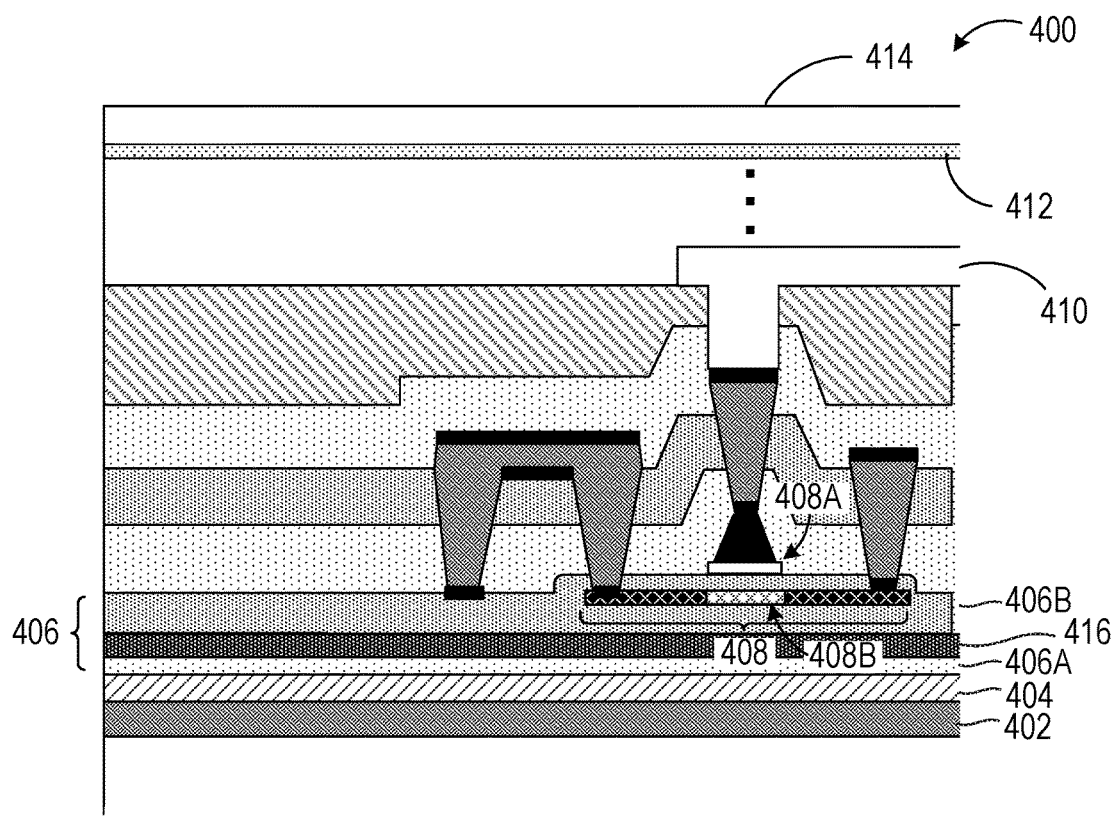
FIG. 4 shows a schematic sectional view of an example OLED display comprising a conductive shielding layer formed between a TFT layer and a polyimide layer.

FIG. 4 shows a schematic sectional view of a portion of another example OLED touch display module 400. Touch display module 400 is yet another example of a touch display module that can be used in device 100. Touch display module 400 includes a substrate layer 402, a polyimide layer 404, a buffer layer 406 comprising a silicon nitride layer 406A and a silicon oxide layer 406B, a plurality of TFTs represented by TFT 408 (which includes a gate electrode 408A and a channel 408B, among other structures), an organic light emitting layer 412, and touch sensor 414 including a cover glass layer and electrode/dielectric layers. As in FIGS. 2 and 3, the vertical ellipsis indicates that one or more layers may be located between organic light emitting layer 412 and the other layers shown in FIG. 4. Other layers not numbered in FIG. 4 include insulating layers in which the TFT structures and various conductors are contained.

Touch display module 400 further comprises a conductive layer 416 disposed between the silicon nitride layer 406A and the silicon oxide layer 406B. In this example, there is no direct connection between polyimide layer 404 and conductive layer 416, or between polyimide layer 404 and a touch display module ground. Instead, conductive layer 416 may shield the polyimide layer 404 from an electric field arising from static charge on the cover glass. This shielding may help to avoid piezoelectric charge displacement in the polyimide layer, and thereby reduce or avoid unwanted low intensity emission from the OLED emitters. Touch display module 400 may be fabricated without any changes to the various patterning and masking steps used to form a touch display module without conductive layer 416. Any suitable material may be used as conductive layer 416. Examples include aluminum, copper, molybdenum and other suitable refractory metals, as well as non-metallic conductors such as indium tin oxide (ITO), depending up on temperatures used in subsequent processes.

Figure 5:
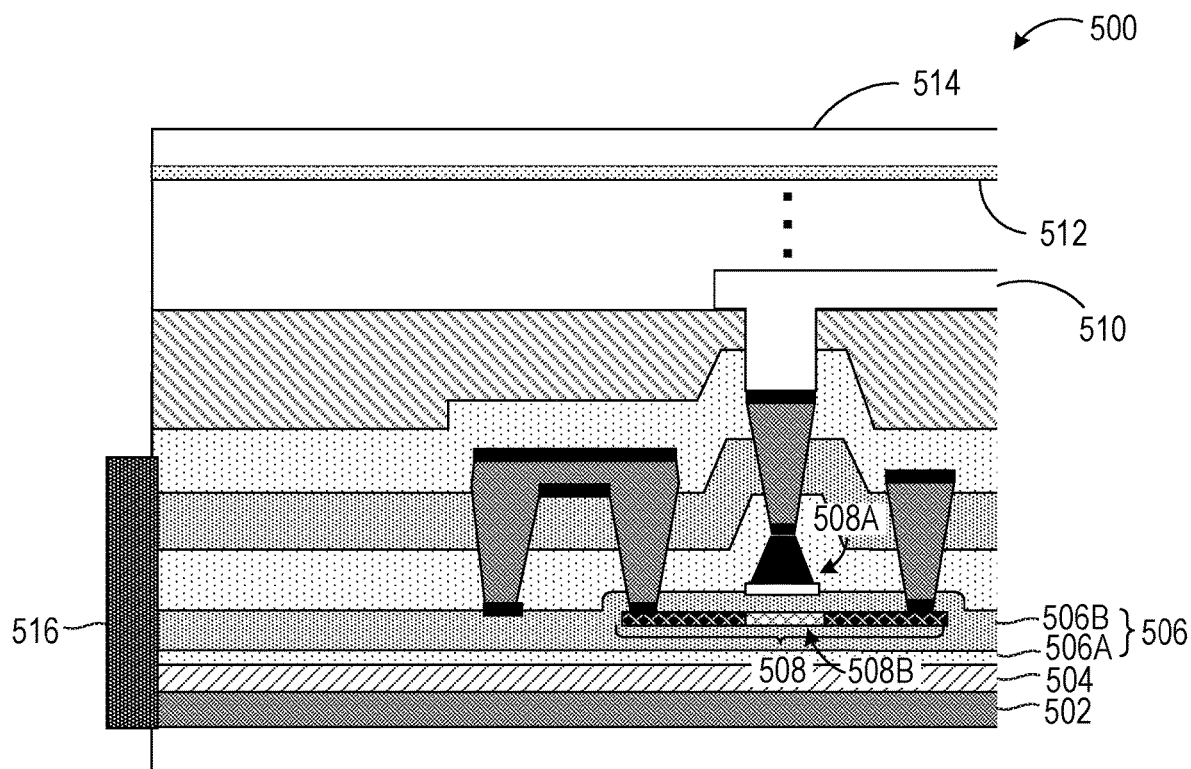
FIG. 5 shows a schematic sectional view of an OLED display having a conductor on an edge of the polyimide layer to couple the polyimide layer to display ground.

FIG. 5 shows a schematic sectional view of another example OLED touch display module 500. OLED touch display module 500 includes a substrate layer 502, a polyimide layer 504, a buffer layer 506 comprising a silicon nitride layer 506A and a silicon oxide layer 506B, a plurality of TFTs represented by TFT 508, a gate electrode 508A and a channel 508B of TFT 508, a conductor 510 connected to the gate electrode 508A, an organic light emitting layer 512, and touch sensor 514. Touch display module 500 further comprises a conductor 516 disposed along an edge of touch display module 500, touching polyimide layer 504 to connect polyimide layer 504 to ground of the touch display module 500. Conductor 516 offers the advantage that no additional thin film processing steps are added to the overall touch display module fabrication process, in contrast with touch display modules 200, 300 and 400. Instead, conductor 516 may be applied, for example, as an ink or in other convenient form. As a more specific example, conductor 516 could be deposited as a curable ink comprising silver particles and/or nanowires, and/or any other suitable conductive organic and inorganic coating materials. Depositing conductor 516 as an ink may allow the conductor to be applied via a relatively simple application process, such as an inkjet or contact printing process. In other examples, any suitable metal other than silver may be used as conductor 516, and conductor 516 may be applied in any other suitable form than as an ink.

In some embodiments, the methods and processes described herein may be tied to a computing system of one or more computing devices. In particular, such methods and processes may be implemented as a computer-application program or service, an application-programming interface (API), a library, and/or other computer-program product.

Figure 6:
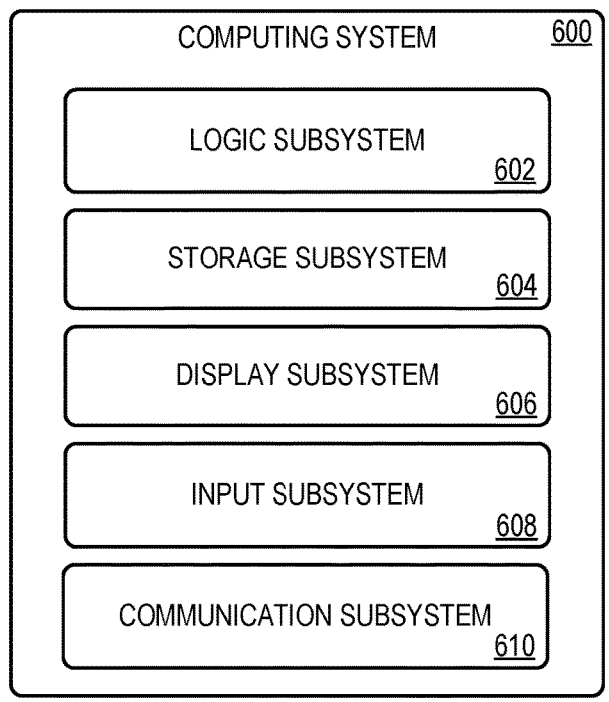
FIG. 6 shows a block diagram of an example computing system.

FIG. 6 schematically shows a non-limiting embodiment of a computing system 600 that can enact one or more of the methods and processes described above. Computing system 600 is shown in simplified form. Computing system 600 may take the form of one or more personal computers, server computers, tablet computers, home-entertainment computers, network computing devices, gaming devices, mobile computing devices, mobile communication devices (e.g., smart phone), and/or other computing devices. Computing system 600 may represent mobile device 100, for example.

Computing system 600 includes a logic subsystem 602 and a storage subsystem 604. Computing system 600 may optionally include a display subsystem 606, input subsystem 608, communication subsystem 610, and/or other components not shown in FIG. 6.

Logic subsystem 602 includes one or more physical devices configured to execute instructions. For example, the logic subsystem 602 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem 602 may include one or more processors configured to execute software instructions. Additionally or alternatively, the logic subsystem 602 may include one or more hardware or firmware logic machines configured to execute hardware or firmware instructions. Processors of the logic subsystem 602 may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic subsystem 602 may be virtualized and executed by remotely accessible, networked computing devices configured in a cloud-computing configuration.

Storage subsystem 604 includes one or more physical devices configured to hold instructions executable by the logic subsystem 602 to implement the methods and processes described herein. When such methods and processes are implemented, the state of storage subsystem 604 may be transformed—e.g., to hold different data.

Storage subsystem 604 may include removable and/or built-in devices. Storage subsystem 604 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 604 may include volatile, nonvolatile, dynamic, static, read/write, read-only, random-access, sequential-access, location-addressable, file-addressable, and/or content-addressable devices.

It will be appreciated that storage subsystem 604 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 602 and storage subsystem 604 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 606 may be used to present a visual representation of data held by storage subsystem 604. This visual representation may take the form of a graphical user interface (GUI). As the herein described methods and processes change the data held by the storage subsystem 604, and thus transform the state of the storage machine, the state of display subsystem 606 may likewise be transformed to visually represent changes in the underlying data. Display subsystem 606 may include one or more display devices utilizing virtually any type of technology. Such display devices may be combined with logic subsystem 602 and/or storage subsystem 604 in a shared enclosure, or such display devices may be peripheral display devices.

When included, input subsystem 608 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 610 may be configured to communicatively couple computing system 600 with one or more other computing devices. Communication subsystem 610 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 600 to send and/or receive messages to and/or from other devices via a network such as the Internet.

Another example provides an electronic device, comprising an organic light emitting diode (OLED) display, the OLED display comprising an organic light emitting layer, a thin film transistor (TFT), a polyimide layer disposed on an opposite side of the TFT as the organic light emitting layer, a buffer layer between the TFT and the polyimide layer, and a conductor positioned to mitigate a piezoelectric response of the polyimide layer to static charge on the electronic device. The conductor may additionally or alternatively connect the polyimide layer to ground. The conductor may additionally or alternatively connect to a ground line of the TFT. The conductor may additionally or alternatively include a conductive layer formed on the polyimide layer. The conductor may additionally or alternatively contact an edge of the polyimide layer. The conductor may additionally or alternatively include a conductive layer disposed on the buffer layer and separated from the polyimide layer. The conductive layer may additionally or alternatively be located between a silicon nitride layer and a silicon oxide layer of the buffer layer. The electronic device may additionally or alternatively include a mobile display device.

Another example provides an electronic device, comprising an organic light emitting diode (OLED) display, the OLED display comprising an organic light emitting layer, a thin film transistor (TFT), a polyimide layer disposed on an opposite side of the TFT as the organic light emitting layer, a buffer layer between the TFT and the polyimide layer, and a conductive shield layered on the buffer layer, the conductive shield configured to mitigate a piezoelectric response of the polyimide layer to static charge on the OLED display.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
    an organic light emitting diode (OLED) display, the OLED display comprising
        an organic light emitting layer;
        a thin film transistor (TFT);
        a polyimide layer disposed on an opposite side of the TFT as the organic light emitting layer;
        a buffer layer between the TFT and the polyimide layer; and
        a conductor positioned to mitigate a piezoelectric response of the polyimide layer to static charge on the electronic device, wherein the conductor connects the polyimide layer to ground via a ground line of the TFT.

2. The electronic device of claim 1, wherein the conductor comprises a conductive layer formed on the polyimide layer.

3. The electronic device of claim 2, wherein the conductive layer comprises molybdenum.

4. The electronic device of claim 3, wherein the conductor comprises a conductive ink.

5. The electronic device of claim 1, wherein the conductor contacts an edge of the polyimide layer.

6. The electronic device of claim 1, wherein the conductor comprises a conductive layer disposed on the buffer layer and separated from the polyimide layer.

7. The electronic device of claim 6, wherein the conductive layer comprises one or more of aluminum, copper, molybdenum, or indium tin oxide.

8. The electronic device of claim 6, wherein the conductive layer is located between a silicon nitride layer and a silicon oxide layer of the buffer layer.

9. The electronic device of claim 1, wherein the electronic device comprises a mobile display device.

10. An electronic device, comprising:
    an organic light emitting diode (OLED) display, the OLED display comprising
        an organic light emitting layer;
        a thin film transistor (TFT);
        a polyimide layer disposed on an opposite side of the TFT as the organic light emitting layer;
        a buffer layer between the TFT and the polyimide layer; and
        a conductive shield layered on the buffer layer, the conductive shield configured to mitigate a piezoelectric response of the polyimide layer to static charge on the OLED display, wherein the conductive shield is located between a silicon nitride layer and a silicon oxide layer of the buffer layer.

11. The electronic device of claim 10, wherein the conductive shield comprises one or more of aluminum, copper, molybdenum, or indium tin oxide.

12. An electronic device, comprising:
    an organic light emitting diode (OLED) display, the OLED display comprising
        an organic light emitting layer;
        a thin film transistor (TFT);
        a polyimide layer disposed on an opposite side of the TFT as the organic light emitting layer;
        a buffer layer between the TFT and the polyimide layer; and
        a conductor in contact with the polyimide layer to connect the polyimide layer to an electrical ground of the OLED display, wherein the conductor connects to a ground line of the TFT.

13. The electronic device of claim 12, wherein the conductor comprises one or more of aluminum, copper, molybdenum, or indium tin oxide.

14. The electronic device of claim 12, wherein the conductor comprises a conductive layer formed on the polyimide layer.

15. The electronic device of claim 12, wherein the conductor contacts an edge of the polyimide layer.

16. The electronic device of claim 15, wherein the conductor comprises a conductive ink.

* * * * *